United States Patent [19]
Ruhman et al.

[11] 4,404,653
[45] Sep. 13, 1983

[54] ASSOCIATIVE MEMORY CELL AND MEMORY UNIT INCLUDING SAME

[75] Inventors: Smil Ruhman; Isaac Scherson, both of Rechovot, Israel

[73] Assignee: Yeda Research & Development Co. Ltd., Rehovot, Israel

[21] Appl. No.: 307,664

[22] Filed: Oct. 1, 1981

[51] Int. Cl.³ .................... G11C 15/04; G11C 11/40
[52] U.S. Cl. ...................................... 365/49; 365/154
[58] Field of Search .................. 365/49, 154, 155, 156, 365/190; 307/279

[56] References Cited

U.S. PATENT DOCUMENTS 3,633,182  1/1972  Koo ........................................ 365/49
3,693,170  9/1972  Ellis et al. ............................. 365/49

FOREIGN PATENT DOCUMENTS 708417  1/1980  U.S.S.R. ................................ 365/49

*Primary Examiner*—Stuart N. Hecker
*Attorney, Agent, or Firm*—Benjamin J. Barish

[57] ABSTRACT

An associative memory cell includes a storage device having a pair of biasing nodes and a pair of output nodes, a plurality of access lines including a pair of BIT-lines and a TAG-line, and a plurality of gates controlling the accessing of the storage device by the access lines. The latter gates include a pair of sampling gates under the control of the BIT-lines and connecting the output nodes of the storage device to a pair of sampling nodes, and a pair of TAG-gates under the control of the sampling nodes and connecting the TAG-lines to one of the pair of the storage device biasing nodes.

The described memory cell further includes READ-control and WRITE-control lines with the associated gates to perform the READ and WRITE functions. The pair of BIT-lines, the WRITE-control line and the READ-control line are all connected to the gate terminals of their respective gates, thereby making the device easier to drive, isolating the memory cell from the BIT-line buses, and improving reliability and speed.

10 Claims, 4 Drawing Figures

BASIC ASSOCIATIVE MEMORY

ASSOCIATIVE MEMORY CELL AND MEMORY UNIT INCLUDING SAME

BACKGROUND OF THE INVENTION

The present invention relates to associative memory cells as used in Content Addressable Memories (CAM's) and also to memory units including pluralities of such cells.

Associative memories are devices in which the storage locations are identified according to their contents, and therefore are frequently called Content Addressable Memories (CAM's). Such memories are to be distinguished from the more widely-used coordinate-addressable memories, such as Random Access Memories (RAM's), which are identified and addressed according to the location or address of the particular cell. Thus, a Content Addressable Memory (CAM) is generally defined as a device capable of holding information, comparing that information with some specified information, and indicating agreement or disagreement between the two. More particularly, the CAM accepts as input a data word and a mask word, searches all address locations simultaneously for a match between the unmasked bits of the data word and all the stored words, and outputs, to a TAG-register, a marker or tag which identified the words which match the input data word in the unmasked bit positions.

Processors using associative memories, or CAM's, are generally recognized as providing two major advantages, namely, speed of operation, and ease of programming, over processors using the conventional coordinate-addressable memories, such as RAM's. However, their main disadvantage is their need for larger numbers of elements to perform the required logical functions, which increases the cost and size of these memories. CAM's have been known as far back as 1956, and since then many efforts have been directed to lowering their manufacturing costs. However, the known designs still are of relatively high cost and large size. Moreover, many or all of the known devices fail to provide operations essential in associative processing, which thereby limits their instruction range; an example of such a limit in the instruction range of the known CAM's is the inability to WRITE masked-ON bits while leaving the remainder unchanged.

SUMMARY OF THE INVENTION

An object of the present invention is to provide a novel associative memory cell having improvements in the above respects. More particularly, an object of the present invention is to provide a memory cell for an associative memory or CAM which, among other advantages over the known designs, can be manufactured at relatively low cost and small size, and does not have the above limit in the instruction range, i.e., the inability to WRITE masked-ON bits of selected words while leaving the remainder unchanged. A further object of the invention is to provide an associative memory unit including a plurality of the novel memory cells.

According to a broad aspect of the present invention, there is provided as associative memory cell including a storage device having a pair of biasing nodes and a pair of output nodes; a plurality of access lines accessing said storage device and including a pair of BIT-lines and a TAG-line; and a plurality of gates controlling the accessing of said storage device by said access lines; characterized in that said plurality of gates includes: a pair of sampling gates under the control of the BIT-lines and connecting the output nodes of the storage device to a pair of sampling nodes; and a pair of TAG-gates under the control of said sampling nodes and connecting the TAG-lines to one of the pair of the storage device biasing nodes.

Such a memory cell without a READ-control line and a WRITE-control line would be capable of performing a COMPARE operation.

Preferably, however, the novel associative memory cell of the present invention also includes one or both of the above control lines.

Thus, it could be constructed to perform a READ-only function by including the READ-control line, whereupon the plurality of gates would further include a pair of READ-gates connecting one of the BIT-lines to one of the biasing nodes, one of the READ-gates being under the control of the READ-control line, the other READ-gate being under the control of the sampling node of the other BIT-line.

If the associative memory cell is also to perform the WRITE function, then it would include a WRITE-control line, and the plurality of gates would further include a pair of WRITE-gates under the control of the WRITE-control line and connecting the sampling nodes to one of the pair of storage device biasing nodes.

According to a further feature in the described preferred embodiment, the pair of BIT-lines, WRITE-control line and READ-control line are all connected to the gate terminals of their respective gates.

The invention also provides an associative memory unit including a plurality of cells each as described above, said cells being disposed according to a rectangular matrix of a plurality of horizontal rows each defining a word, and a plurality of vertical columns, said BIT-lines being common to the vertical columns of cells, and said control lines and TAG-line being common to the horizontal rows of cells.

Such an associative memory unit further includes a MASK-register for specifying the bits in a word to be associated; a COMPARAND-register for specifying the specific pattern to be compared; and a TAG-register for tagging the words in the memory unit which have the specified pattern in the specified bits to be associated.

An associative memory cell including the foregoing features permits the construction of an associative memory unit having a number of important advantages over the known CAM units. One important advantage is that this construction utilizes all the possible states of the BIT-lines to increase the permissible instruction range, and particularly to provide the capability to WRITE masked-ON bits of selected words while leaving the remainder unchanged, an operation heretofore not permitted by the known CAM's. In addition, the two BIT-lines, and the WRITE- and READ-control lines, are all connected to the gate terminals of the respective gates, thereby making the device easier to drive. Further, this arrangement isolates the memory cells from the BIT-line buses, and thereby improves reliability and speed.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF A PREFERRED EMBODIMENT

Figure 1:
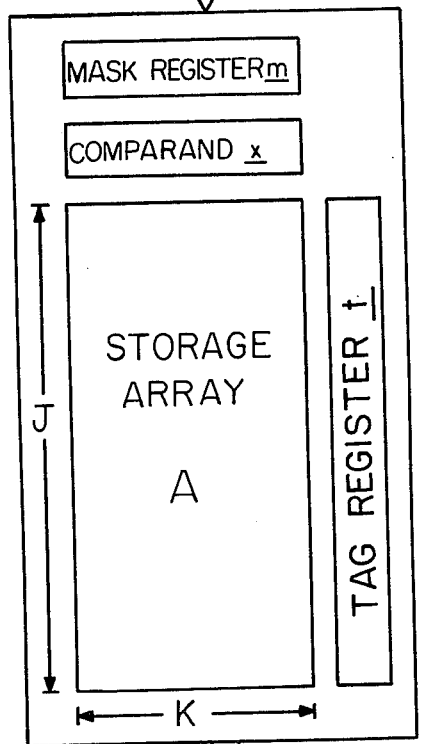
FIG. 1 illustrates a basic associative memory unit or CAM with respect to which the present invention is particularly directed.

FIG. 1 illustrates the overall design of a basic associative memory unit or CAM. Such a unit consists of a plurality of words each consisting of a plurality of basic bit cells. The words are disposed in a plurality of horizontal rows (J) within the Storage Array A, and the bits are disposed in a plurality of vertical columns (K) within the Storage Array A. For example, the memory unit of FIG. 1 may include 4096 words (J) each of 32 bits (K) in length, or a total of 128,000 bits.

Each cell within the Storage Array A has associated with it a TAG-bit. The collection of these TAG-bits is found in the TAG-register t, sometimes referred to as the response store, accessed by an inlet bus It and an outlet bus Ot.

The basic associative memory unit illustrated in FIG. 1 further includes a MASK-register m and a COMPARAND-register x, both controlled by a central control unit within the computer. When performing a simple search of all the cells within the Storage Array A, the MASK-register m is used to specify the bits of the word to be compared, and the COMPARAND-register x is used to specify the pattern to be compared. For example, if only the first ten bits of a 32-bit word are to be compared with the pattern specified in the COMPARAND-register x, the MASK-register m would include a "one" for each of the first ten bits (which are to be compared), and a "zero" for each of the remaining bits.

When a SET-command is received, this causes all the TAG-bits within the TAG-register t to be set to "one". When the central control unit issues a COMPARE-command, any word containing at least one bit which does not match the unmasked bits (as specified in the MASK-register m) of the COMPARAND (as specified in the COMPARAND-register x) will cause the respective TAG-bit to be reset to "zero". Thus, after a COMPARE-command, only those cells whose unmasked bits correspond to the COMPARAND will be left with their TAG-bits set to "zero".

More particularly, the basic associative memory illustrated in FIG. 1 is defined to have the following operations:

| For all $j=0,1,\ldots, J-1$ and all $k=0,1,\ldots, K-1$ | |
|---|---|
| 1. SETAG | $t_j \leftarrow 1$ |
| 2. LOAD x | $x_k \leftarrow 0$, $x_k \leftarrow 1$, or $x_k \leftarrow i_k$ |
| 3. LOAD m | $m_k \leftarrow 0$, $m_k \leftarrow 1$, or $m_k \leftarrow i_k$ |
| 4. COMPARE | $t_j \leftarrow t_j \overline{\sum_k m_k (a_{jk} \oplus x_k)}$ |
| 5. WRITE | $a_{jk} \leftarrow \bar{t}_j a_{jk} + t_j (m_k x_k + \bar{m}_k a_{jk})$ |
| 6. READ | $o_k \leftarrow \overline{\sum_j (\bar{a}_{jk}) t_j}$ |

The symbols $+$, $\oplus$, and $\Sigma$ stand for OR, Exclusive-OR, and OR expansion respectively. $\bar{m}$ denotes the complement of m. Both WRITE and COMPARE operate just on masked ON-bits ($m_k=1$) of words (rows) that are tagged ($t_j=1$). Hence the SETAG operation is required initially to make all words eligible for processing. Up to four operations may be done concurrently during a given memory cycle, as follows:

(1) SETAG, (2) LOAD x, (3) LOAD m, and (4) COMPARE, WRITE or READ. Clearly, any subset of the above may also be concurrent, and when registers x and m are loaded from the input bus simultaneously, they must receive the same data.

Figure 2:
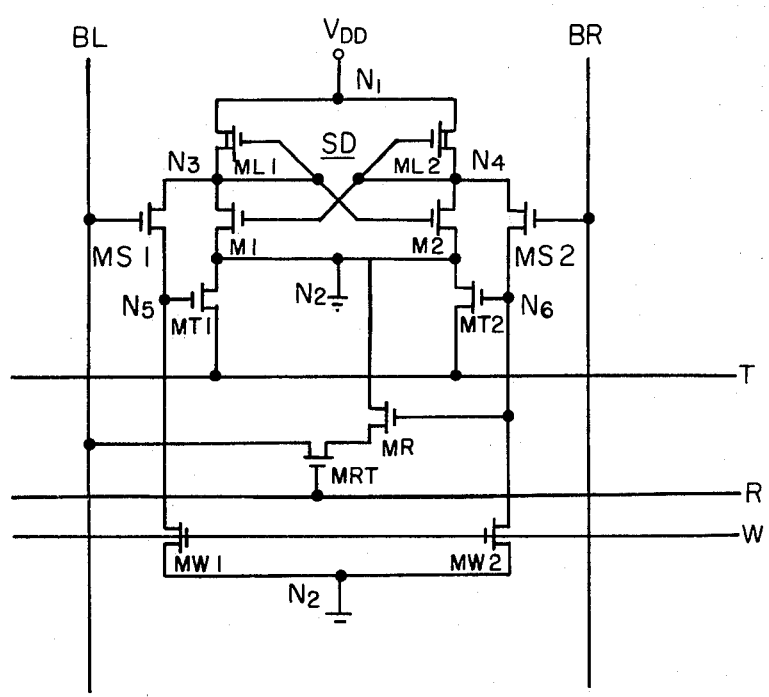
FIG. 2 illustrates one form of twelve-transistor associative memory cell constructed in accordance with the present invention.
Figure 3:
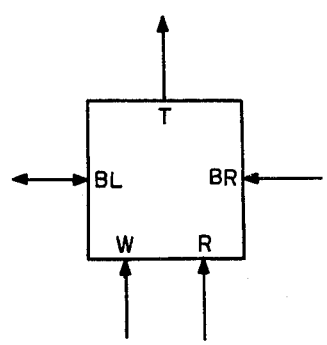
FIG. 3 is a simplified block diagram illustrating the inputs and output of the memory cell of FIG. 2.

FIG. 2 illustrates one form of twelve-transistor NMOS (N-channel Metal-Oxide-Semiconductor) associative memory cell constructed in accordance with the present invention to implement the foregoing functions; and FIG. 3 is a simplified block diagram illustrating the four inputs and the output of the memory cell of FIG. 2. The cell illustrated in FIG. 2 was evaluated by computer simulation, which indicated that the layout of the cell using 6 μm silicon-gate technology would enable 1024 bits to easily fit on a standard chip. A 32×32 array, together with appropriate drivers and peripheral circuits, can perform the longest instructions (COMPARE or READ) in up to 100 nsec with a maximum power dissipation of 250 mwatts. For the 3 μm technologies in current use, chip capacity is expected to reach 4,096 with equal or higher speed, and with equal or lower dissipation.

Briefly, the cell illustrated in FIG. 2 includes a static flip-flop as the storage device, and five access lines accessing the storage device. These access lines comprise four input lines, namely a pair of BIT-lines BL, BR, a WRITE-control line W, and a READ-control line R; and one output line, namely TAG-line T. These access lines are also clearly illustrated in the simplified block diagram of FIG. 3. The accessing of the storage device by these access lines is under the control of a plurality of gates implemented by insulated-gate field-effect transistors (IGFET), as will be described more particularly below.

Thus, the associative memory cell illustrated in FIG. 2 comprises a storage device SD in the form of a flip-flop consisting of four transistors $M_1$, $M_2$, $ML_1$, $ML_2$, having a pair of biasing nodes $N_1$, $N_2$, and a pair of output nodes $N_3$, $N_4$. In the illustrated arrangement, biasing node $N_1$ of the flip-flop is adapted to receive a biasing voltage $V_{DD}$, and biasing node $N_2$ is connected to ground.

Output node $N_3$ of the flip-flop SD is connected to another node $N_5$, called a sampling node, via a transistor-gate $MS_1$ whose gate electrode is connected to BIT-line BL; and the other output node $N_4$ of the flip-flop is connected to a sampling node $N_6$ via a transistor-gate $MS_2$ whose gate electrode is connected to the other BIT-line BR. Sampling nodes $N_5$ and $N_6$ are in turn connected to ground via WRITE-gates $MW_1$ and $MW_2$, whose gate electrodes are connected to the WRITE-control line W.

The memory cell illustrated in FIG. 2 further includes a pair of READ-gates MR and MRT which can be controlled to connect BIT-line BL to ground. The gate electrode of READ-gate MRT is connected to the READ-control line R, and the gate electrode of the READ-gate MR is connected to sample node $N_6$, so that BIT-line BL is grounded whenever a "one" appears on READ-control line R coincident with a "one" on the sampling node $N_6$.

The TAG-line T is connected to ground, via gates $MT_1$ or $MT_2$ whenever a "one" appears on sample node $N_5$ or $N_6$, respectively.

Figure 4:
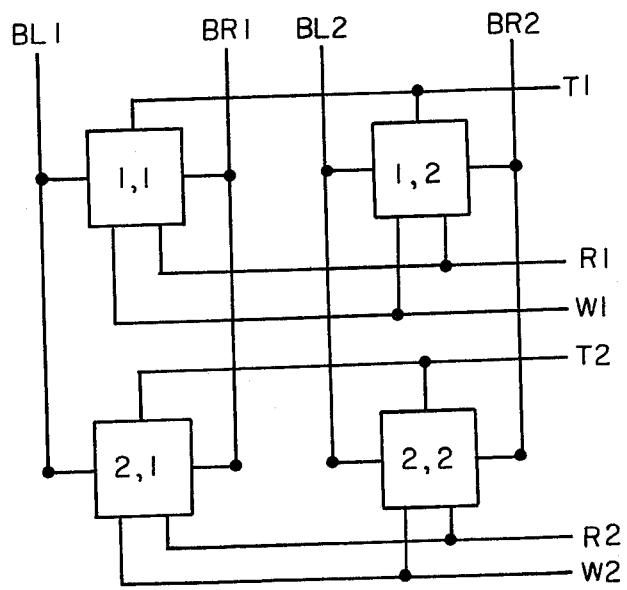
FIG. 4 illustrates a 2×2 array of associative memory cells according to FIGS. 2 and 3 as incorporated in an associative memory unit constructed to include a large number of such cells.

FIG. 4 illustrates a 2×2 bit array to show how the cells are interconnected to form a word-organized associative memory. BIT-lines are common to vertical columns (BIT-slices), while the READ-control line R, the WRITE-control line W, and the TAG-line T are common to horizontal rows (words).

Table I illustrates the signals on the four input access lines W, R, BL, BR, to perform the various operations of the memory unit.

TABLE I

| W | R | BL | BR | OPERATION |
|---|---|----|----|-----------|
| 0 | 0 | 0  | 0  | STANDBY or COMPARE ∅ |
| 0 | 0 | 0  | 1  | COMPARE to 1 |
| 0 | 0 | 1  | 0  | COMPARE to 0 |
| 0 | 0 | 1  | 1  | forces a mismatch |
| 1 | 0 | 0  | 0  | WRITE ∅ |
| 1 | 0 | 0  | 1  | WRITE 1 |
| 1 | 0 | 1  | 0  | WRITE 0 |
| 0 | 1 | *  | 1  | READ |

*state determined by result of READ

Following is a more detailed description of each of the above operations of Table I with particular reference to the memory cell illustrated in FIG. 2, it being assumed that all lines are initially low for every operation:

WRITE-operation

A WRITE-operation is started by raising the WRITE-control line W to a "one". Gates $MW_1$ and $MW_2$ are turned ON, forcing sampling nodes $N_3$ and $N_4$ to ground. The new state of the flip-flop SD will be determined by the condition of BIT-lines BL and BR; to write a "zero" or a "one", these bit lines must be complementary. If BIT-line BL (BR) is high, transfer gate $MS_1$ ($MS_2$) will conduct forcing the output node $N_3$ ($N_4$) of flip-flop SD to ground (which is defined as the "zero" ("one") state.) If both bit lines are low, the flip-flop SD will not be affected. A WRITE ϕ (a "null" write, or "don't WRITE"), is then effected in all bits of the corresponding bit-slice. This enables writing on bits selected by the mask, while leaving the rest of the word unchanged.

It should be noted that WRITE ϕ has the effect of discharging the sampling nodes $N_3$ and $N_4$. This fact will be used in the COMPARE-operation.

COMPARE-operation

The matching logic is formed by transistors $MS_1$, $MS_2$, $MT_1$ and $MT_2$ under control of the BIT-lines BL and BR. To compare to "zero" ("one"), BIT-line BL (BR) is raised to "one", transferring the state of the flip-flop output node $N_3$ ($N_4$) to $MT_1$ ($MT_2$) via $MS_1$ ($MS_2$). If output node $N_3$ ($N_4$) is a "one", there is a mismatch and the TAG-line T is forced to ground. The TAG-line T may be precharged high, or terminated with a load to $V_{DD}$ in order to keep it high when all bits of the word match. As in a WRITE-operation, masking-OFF a bit-slice is accomplished by holding both BIT-lines BL, BR low.

The sampling nodes $N_5$ and $N_6$ are capable of retaining a charge that depends on the cell's recent history, and could cause a spurious mismatch. Therefore, a COMPARE-cycle starts with a WRITE "ϕ" ("don't care" command) in all bits of the word. Advantage can be taken of this phase to perform register operations and precharge the TAG-line T if necessary.

READ-operation.

A READ-operation is defined by raising BIT-line Br and terminating BIT-line BL with a resistive load to $V_{DD}$. BIT-line BL is bidirectional, producing an output during the READ-operation. The state of flip-flop node $N_4$ is transferred through transistor $MS_2$ to the gate of transistor MR. A READ-operation is effected by raising READ-line R to "one". If flip-flop node $N_4$ is high, MR will conduct pulling BIT-line BL low via transfer gate MRT: otherwise, BIT-line BL will go high. Activating more than one READ-line R will "AND" corresponding bits onto BIT-line BL. Similarly, inverting the connections of transistors MR and MRT to the BIT-line will produce a "NOR" at BIT-line BR.

It will thus be seen that the memory cell described above utilizes all the possible states of the BIT-lines to increase the permissible instruction range, and particularly to provide a capability to WRITE masked-ON bits of selected words while leaving the remainder unchanged. In addition, all the input access lines are connected to the gate terminals of the respective transistor gates, thereby making the device easier to drive. Further, the illustrated arrangement isolates the storage devices (flip-flops) SD of the memory cells from the BIT-lines, and thereby improves reliability and speed.

While the invention has been described with respect to one preferred embodiment, it will be appreciated that many other variations, modifications and applications of the invention may be made.

What is claimed is:

1. An associative memory cell including: a storage device having a pair of biasing nodes and a pair of output nodes; a plurality of access lines accessing said storage device and including a pair of BIT-lines and a TAG-line; and a plurality of gates controlling the accessing of said storage device by said access line; characterized in that said plurality of gates include:

a pair of sampling gates under the control of the BIT-lines and connecting the output nodes of the storage device to a pair of sampling nodes; and a pair of TAG-gates under the control of said sampling nodes and connecting the TAG-lines to one of the pair of the storage device biasing nodes.

2. An associative memory cell according to claim 1, wherein said memory cell further includes a READ-control line, and said plurality of gates further include a pair of READ-gates connecting one of said BIT-lines to one of said biasing nodes; one of said READ-gates being under the control of said READ-control line, the other of said READ-gates being under the control of the sampling node of the other of said BIT-lines.

3. An associative memory cell according to claim 1, wherein said memory cell further includes a WRITE-control line, and said plurality of gates further include a pair of WRITE-gates under the control of the WRITE-control line and connecting the sampling nodes to one of the pair of the storage device biasing nodes.

4. An associative memory cell according to claim 1, wherein said storage device is a static flip-flop storage device.

5. An associative memory cell according to claim 1, wherein said gates are all insulated-gate field-effect-transistors.

6. An associative memory unit including a plurality of cells each according to claim 1, said cells being disposed according to a rectangular matrix of a plurality of horizontal rows each defining a word, and a plurality of vertical columns, said BIT-lines being common to the vertical columns of cells, and said control lines and TAG-line being common to the horizontal rows of cells.

7. An associative memory unit according to claim 6, further including:
   a MASK-register for specifying the bits in a word to be associated;
   a COMPARAND-register for specifying the specific pattern to be compared;
   and a TAG-register for tagging the words in the memory unit which have the specified pattern in the specified bits to be associated.

8. An associative memory unit according to claim 6, incorporated in a single-chip MOS device.

9. An associative memory cell including: a storage device having a pair of biasing nodes and a pair of output nodes; a plurality of access lines accessing the storage device and including a pair of BIT-lines, a WRITE-control line, a READ-control line and a TAG-line; and a plurality of gates controlling the accessing of said storage device by said access lines; characterized in that said plurality of gates include:
   a pair of sampling gates under the control of the BIT-lines and connecting the output nodes of the storage device to a pair of sampling nodes;
   a pair of WRITE-gates under the control of the WRITE-control line and connecting the sampling nodes to the pair of storage device biasing nodes;
   a pair of TAG-gates under the control of said sampling nodes and connecting the TAG-line to one of the pair of storage device biasing nodes;
   and a pair of READ-gates connecting one of said BIT-lines to one of said storage device biasing nodes, one of said READ-gates being under the control of said READ-control line, and the other of said READ-gates being under the control of said sampling node of the other of said BIT-lines.

10. An associative memory cell according to claim 9, wherein said pair of BIT-lines, WRITE-control line and READ-control line are all connected to the gate terminals of their respective gates.

* * * * *